United States Patent [19]

Petty et al.

[11] Patent Number: 5,726,597

[45] Date of Patent: Mar. 10, 1998

[54] METHOD AND CIRCUIT FOR REDUCING OFFSET VOLTAGES FOR A DIFFERENTIAL INPUT STAGE

[75] Inventors: Thomas D. Petty, Tempe; Richard S. Griffith, Chandler; Robert L. Vyne, Tempe; Robert N. Dotson, Chandler, all of Ariz.

[73] Assignee: Motorola, Inc., Schaumburg, Ill.

[21] Appl. No.: 706,095

[22] Filed: Aug. 30, 1996

[51] Int. Cl.[6] ............................................. H03K 5/22
[52] U.S. Cl. ................... 327/307; 327/563; 327/65; 330/258
[58] Field of Search ................... 327/306, 307, 327/362, 563, 65; 330/258

[56] References Cited

U.S. PATENT DOCUMENTS

| | | | |
|---|---|---|---|
| 4,948,746 | 8/1990 | Beasom | 437/44 |
| 4,948,992 | 8/1990 | Bukowski, Jr. | 307/491 |
| 5,010,377 | 4/1991 | Beasom | 357/22 |
| 5,475,323 | 12/1995 | Harris et al. | 327/65 |

Primary Examiner—Timothy P. Callahan
Assistant Examiner—Dinh T. Le
Attorney, Agent, or Firm—Rennie William Dover

[57] ABSTRACT

A trim circuit (10) and method of reducing offset voltages in a differential input stage. The differential input transistors (32 and 42) have separate bulk terminals for receiving a voltage to compensate for the input offset voltage. A current source (60) supplies a static current to the offset compensation circuit for generating a bias voltage at node (55). The transistors (64 and 66) receive a voltage at input terminals (30 and 40) and supply an additional current to an offset compensation circuit (20). A switch circuit (50) has switch pairs (52, 56, and 54, 58) for transferring a voltage to the bulk terminal of one of the differential transistors (32 and 42) while grounding the bulk terminal of the other transistor. The differential voltage supplied across the bulk terminals of transistors (32 and 42) changes the threshold voltage of the transistors reducing the offset voltage of the input stage.

16 Claims, 1 Drawing Sheet

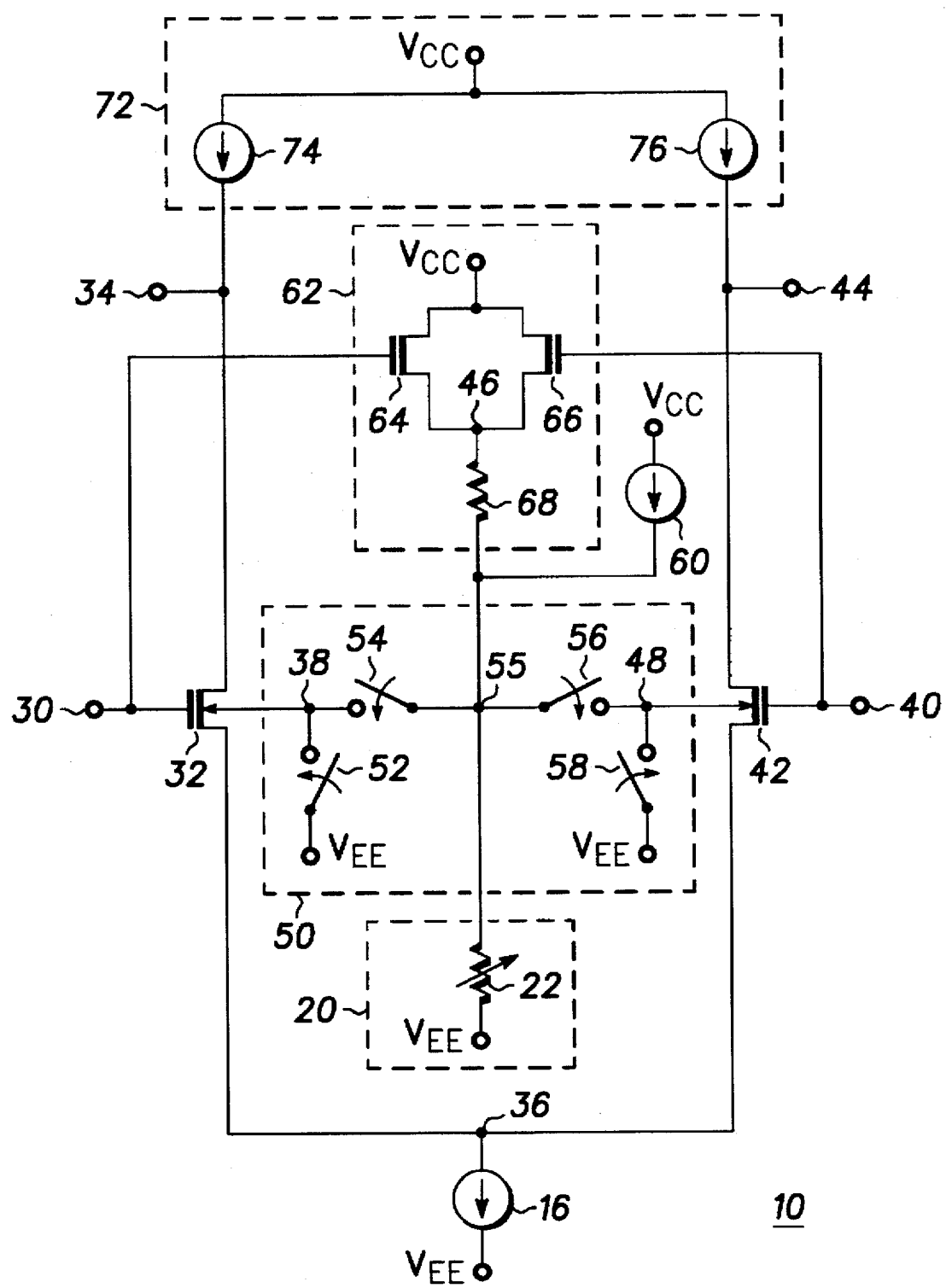

METHOD AND CIRCUIT FOR REDUCING OFFSET VOLTAGES FOR A DIFFERENTIAL INPUT STAGE

BACKGROUND OF THE INVENTION

The present invention relates, in general, to a differential input stage of an integrated circuit amplifier and, more particularly, to structures and methods for reducing an offset voltage of a differential input amplifier stage.

Offset voltage reduces performance of a differential amplifier. An offset voltage is amplified by an amplifier when placed in a gain configuration producing a DC voltage at an output of the amplifier. An offset voltage of an amplifier results from device mismatches of an input differential transistor pair due to wafer process variations in fabricating the devices. One type of device commonly used for a differential transistor pair is an Insulated Gate Field Effect Transistor (IGFET). Amplifiers formed from IGFETs are prone to having significant offset voltages due to device mismatches. One consequence of voltage offset in a differential input stage is to reduce the dynamic output range for low voltage amplifiers.

Therefore, for precision applications, it is desirable to cancel all offset voltages. The input differential stage is typically coupled to a current mirror stage. Ideally, under quiescent conditions each device of the current mirror stage conducts equal currents. An offset voltage would produce unequal currents in the current mirror stage. One technique commonly used to reduce offset voltage of a differential input stage is to change the current conducted by the current mirror stage under quiescent conditions to be equal. Accordingly, current sources have been used to steer supply current to, or away from, the input differential pair transistors (to modify current received by the current mirror stage) in such a way that the sum of the operating current for the input transistor pair is largely constant.

It would be of great benefit if a circuit and method could be provided to more efficiently reduce offset voltage of a differential input amplifier stage.

BRIEF DESCRIPTION OF THE DRAWING

The sole FIGURE illustrates in schematic form, a trim circuit for generating a differential voltage across the bulk terminals of a differential transistor pair to reduce voltage offset in accordance with the present invention.

DETAILED DESCRIPTION OF THE DRAWING

The sole FIGURE illustrates in schematic form, a trim circuit 10 for generating a differential voltage across the bulk terminals of a differential transistor pair to reduce voltage offset in accordance with the present invention.

Trim circuit 10 has a differential input at terminals 30 and 40 and a differential output at terminals 34 and 44. Transistors 32 and 42 form a differential transistor pair for a trimmable differential input stage. Transistors 32 and 42 are typically not perfectly matched due to wafer process variations which produce an offset voltage across output terminals 34 and 44 under quiescent operating conditions. The offset voltage of transistors 32 and 42 corresponds to a voltage applied across input terminals 30 and 40 which produces an equal voltage at output terminals 34 and 44. The offset voltage also varies with integrated circuit temperature and input common mode voltage. Trim circuit 10 reduces the offset voltage by providing a differential voltage across the bulk terminals of transistors 32 and 42. The differential voltage across the bulk terminals of transistors 32 and 42 changes the threshold voltage of each device. The change in threshold voltage compensates for device mismatches due to process variations.

Trim circuit 10 includes transistors 32 and 42, offset compensation circuit 20, switch circuit 50, common mode compensation circuit 62, current source 60, and current source circuit 72. Trim circuit 10 receives a differential input voltage across input terminals 30 and 40 and provides a differential output voltage across output terminals 34 and 44.

Transistors 32 and 42 have a drain, gate, source, and bulk, respectively corresponding to a first electrode, a control electrode, a second electrode, and a bulk. In particular, transistor 32 has a drain connected to output terminal 34, a gate connected to input terminal 30, a source connected to a node 36, and a bulk connected to a node 38. Transistor 42 has a drain connected to output terminal 44, a gate connected to input terminal 40, a source connected to node 36, and a bulk connected to a node 48. Transistors 32 and 42 are fabricated in separate wells or tubs such that each transistor has a separate bulk region that is independent of the other, i.e., transistors 32 and 42 have electrically isolated bulk terminals.

A current source 16 provides a current for biasing transistors 32 and 42. Current source 16 has a first terminal connected to node 36 and a second terminal connected to a power supply terminal for receiving a power supply voltage $V_{EE}$. A current source 60 provides a static current flowing through a trimmable resistive element 22. Current source 60 has a first terminal connected to node 55 and a second terminal connected to a power supply terminal for receiving a power supply voltage $V_{CC}$.

Offset compensation circuit 20 provides a first voltage for generating a differential voltage across the bulk terminals of transistors 32 and 42. In an embodiment of offset compensation circuit 20 a trimmable resistive element 22 is used. Trimmable resistive element 22 has a first terminal connected to a node 55 and a second terminal connected to the power supply terminal for receiving the power supply voltage $V_{EE}$.

Switch circuit 50 connects a differential voltage across the bulks of transistors 32 and 42. Switch circuit 50 comprises a switch 52, a switch 54, a switch 56, and a switch 58. The bulk of transistor 32 is coupled to either the power supply voltage $V_{EE}$ or the voltage at node 55. Switches 52 and 54 connect a voltage to the bulk of transistor 32 to modify the threshold voltage. Switch 52 connects the power supply voltage $V_{EE}$ to node 38. Switch 52 has a first terminal connected to node 38 and a second terminal connected to the power supply terminal for receiving the power supply voltage $V_{EE}$. Switch 54 connects the voltage at node 55 to the bulk of transistor 32. Switch 54 has a first terminal connected to node 38 and a second terminal connected to node 55.

Switches 56 and 58 connect a voltage to the bulk of transistor 42 to modify the threshold voltage. Switch 58 connects the power supply voltage $V_{EE}$ to node 48. Switch 58 has a first terminal connected to node 48 and a second terminal connected to the power supply terminal for receiving the power supply voltage $V_{EE}$. Switch 56 connects the voltage at node 55 to the bulk of transistor 42. Switch 56 has a first terminal connected to node 48 and a second terminal connected to node 55.

Common mode compensation circuit 62 adjusts the voltage at node 55 to compensate for changes in the common mode voltage at the input terminals 30 and 40. The common mode voltage affects the offset voltage of the differential transistor pair. The voltage offset compensation would be good for only a single common mode voltage without common mode compensation circuit 62. Common mode compensation circuit 62 has a first input connected to input terminal 30, a second input connected to input terminal 40, and an output connected to node 55. Common mode compensation circuit 62 comprises transistors 64 and 66, and resistor 68. Transistors 64 and 66 have a drain, a gate, and a source respectively corresponding to a first electrode, a control electrode, and a second electrode. Transistor 64 has a drain connected to a power supply terminal for receiving a power supply voltage $V_{CC}$, a gate connected to input terminal 30, and a source connected to a node 46. Transistor 66 has a drain connected to the power supply terminal for receiving the power supply voltage $V_{CC}$, a gate connected to input terminal 40, and a source connected to node 46. Resistor 68 has a first terminal connected to node 46 and a second terminal connected to node 55.

A current source circuit 72 has two current conducting terminals. Current source 74 is connected between the power supply terminal for receiving the power supply voltage $V_{CC}$ and a first current conducting terminal which is connected to output terminal 34. Current source 76 is connected between the power supply terminal for receiving the power supply voltage $V_{CC}$ and a second current conducting terminal which is connected to output terminal 44. The combined current of current sources 74 and 76 equals the current of current source 16. Current source circuit 72 is often implemented as a current mirror stage as is well known in the art.

In operation, common mode compensation circuit 62 operates to minimize a change in offset voltage due to a common mode input voltage at the input terminals 30 and 40. Transistors 64 and 66 operate over the common mode range of the input signals as a source follower to supply current to the resistor voltage divider formed by resistor 68 and trimmable resistive element 22. The voltages at nodes 46 and 55 change as the common mode voltage changes. By way of example, transistors 64 and 66 are N-type depletion mode transistors having gate widths of ten microns and gate lengths of five microns. Transistors 64 and 66 affect the threshold voltages of transistors 32 and 42 by changing the differential voltage at the bulk terminals of transistors 32 and 42. By way of example, transistors 32 and 42 are N-type depletion mode transistors having gate widths of five-hundred microns and gate lengths of five microns.

Offset compensation circuit 20 has a weighted binary resistor string with selectable resistors (not shown) to reduce the offset voltage of transistors 32 and 42. The weighted binary resistor string corresponds to trimmable resistive element 22. By way of example, the weighted binary resistor string has five resistors with values of 62 ohms for a first resistor, 126 ohms for a second resistor, 253 ohms for a third resistor, 506 ohms for a fourth resistor, and 1 kilohms for a fifth resistor. The five resistors allow a possible 32 different resistor combinations. Fusible ZENER links well known to one skilled in the art provide a method for selecting a resistor combination. Trimmable resistive element 22 is an equivalent resistor selected from a plurality of trimmable resistors or a plurality of selectable resistors. Trimmable resistive element 22 has a resistance value in accordance with the selected resistor values after fusible ZENER links have been closed. Trimmable resistive element 22 using the five resistor scheme described hereinabove has a value ranging from approximately zero ohms to two kilohms. Both trimmable and selectable resistors which can be used in offset compensation circuit 20 are known to one skilled in the art. It is understood that the invention is not limited to the particular structure and method for providing trimmable or selectable resistors.

Trimmable resistive element 22 and resistor 68 are connected as a resistor voltage divider that supplies a bias compensation voltage at node 55. By way of example, resistor 68 has a resistance of 200 kilohms. The bias compensation voltage supplied at node 55 ranges from about zero volts to about sixteen millivolts and is selected by switch circuit 50 to connect to either the bulk terminal of transistor 32 or to the bulk terminal of transistor 42.

Operating potential $V_{CC}$ has a range of about one volt to about twelve volts. Operating potential $V_{EE}$ could have a negative voltage value but is discussed in this application as being ground. The bias compensation voltage supplied at node 55 ranges from zero millivolts to about sixteen millivolts when $V_{EE}$ is at ground potential.

The bias compensation voltage supplied at node 55 is selected by switch circuit 50 to connect to bulk terminals of transistors 32 and 42. A voltage change at the bulk terminal of transistors 32 or 42 does not have the same effect on the differential voltage at output terminals 34 and 44 as a voltage change at the gate terminals. For instance, the drain voltage of transistors 32 and 42 are approximately half as responsive to a voltage change at the bulk than a voltage change at the gate.

Switch circuit 50 operates by closing switches in pairs. For example, switches 52 and 56 are closed as a switch pair and switches 54 and 58 are closed as a switch pair. For instance, switches 52 and 56 are closed to respectively connect the bulk of transistor 32 with the power supply voltage $V_{EE}$ and to connect the bulk of transistor 42 with the voltage at node 55. Conversely, switches 54 and 58 are closed to respectively connect the bulk of transistor 32 to the node 55 and the bulk of transistor 42 to the power supply voltage $V_{EE}$. By way of example, switches 52, 54, 56, and 58 are ZENER diodes operating as fuses in providing an electrical conduction path. One pair of switches are fused to permanently couple an appropriate differential voltage to the bulks of transistors 32 and 42 to cancel an offset voltage. It is understood that the invention is not limited to the particular structure and method for providing selectable switches.

Providing a reduction in offset voltage involves selecting both switch closures in switch circuit 50 and a resistor selection in offset compensation circuit 20. Switch closures and resistor selections provide a bias compensation voltage at node 55 that reduces an offset voltage while operating common mode with zero volts at input terminals 30 and 40. To generate the bias compensation voltage, current source 60 supplies a static current flowing through trimmable resistive element 22. By way of example, current source 60 supplies a current of eight microamps.

As an example, transistors 32 and 42 of trim circuit 10 operating in common mode could have an offset voltage of two millivolts due to processing mismatch. For instance, the differential output voltage at output terminal 44 is larger than the voltage at output terminal 34. A two millivolt voltage offset is found when the output voltage difference is translated back to the inputs. To reduce the offset voltage, the paired switch combination of 52 and 56 is selected and switches 52 and 56 are closed. The bulk of transistor 32 is connected to the voltage $V_{EE}$ and the bulk of transistor 42 is connected to the voltage at node 55. The voltage at node 48 is greater than the voltage at node 38 under this condition.

The voltage at node 48 decreases the threshold voltage of transistor 42 in relation to the threshold voltage of transistor 32.

The transconductance of transistors 32 and 42 represents the change of drain current versus gate voltage (at a fixed drain voltage). A change in voltage at the bulk also affects device transconductance. The effect on the transconductance of transistors 32 and 42 is approximately half as much when the voltage change occurs due to the bulk voltage versus the gate voltage. To compensate for a voltage offset, a voltage twice as great must be applied to the bulk of a transistor. For example, a voltage of four millivolts at node 55 compensates for a two millivolt offset voltage of transistors 32 and 42.

By way of example, the upper voltage supplied at node 55 is sixteen millivolts in accordance with current source 60 supplying a current of eight microamps flowing through a two kilohm resistance for trimmable resistive element 22. Therefore, four millivolts is generated at node 55 with a five-hundred ohm resistance value selected for trimmable resistive element 22. By selecting the appropriate paired switch combination of switches 52 and 56, a voltage of four millivolts at node 55 is connected to the bulk of transistor 42 and the voltage $V_{EE}$ is connected to the bulk of transistor 32. The offset voltage is reduced to approximately zero volts and the voltage at terminals 34 and 44 are approximately matched.

As another example, transistors 32 and 42 operating in common mode could have an offset voltage of two millivolts due to processing mismatch. For instance, the differential output voltage at output terminal 34 is larger than the voltage at output terminal 44. A two millivolt voltage offset is found when the output voltage difference is translated back to the inputs. To reduce the offset voltage, the paired switch combination of 54 and 58 is selected and switches 54 and 58 are closed. The bulk of transistor 42 is connected to the voltage $V_{EE}$ and the bulk of transistor 32 is connected to the voltage at node 55. The five-hundred ohm resistance value for trimmable resistive element 22 connected as a voltage divider with resistor 68 supplies four millivolts at node 55. The voltage at node 38 is greater than the voltage at node 48 under this condition. The voltage at node 38 decreases the threshold voltage of transistor 32.

An increase in the common mode voltage at terminals 30 and 40 provides an increase in the bias compensation voltage at node 55. For instance, current source 60 provides eight microamps of static current that flows through a five-hundred ohm trimmable resistive element 22 to provide four millivolts at node 55. In addition to the static current, a dynamic current in transistors 64 and 66 provides a current flowing through trimmable resistive element 22 to provide a higher bias compensation voltage at node 55. Three volts applied at input terminals 30 and 40 provides 7.5 millivolts at node 55 in accordance with the values of 200 kilohms for resistor 68 and 500 ohms for trimmable resistive element 22. Therefore, the voltage across trimmable resistive element 22 is about (500 ohms/200 kilohms times three volts) 7.5 millivolts higher as a result of the dynamic current. The ratio of resistor 68 to trimmable resistive element 22 forms a linear approximation of the transconductance roll-off with the voltage supplied at the common sources of transistors 64 and 66.

By now it should be appreciated that the present invention provides a differential input amplifier stage having a selectable or trimmable resistor network to efficiently reduce temperature drift and offset voltage.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For instance, the differential pair of input transistors (32 and 42) can be either enhancement mode or depletion mode transistors. Transistors 32, 42, 64, and 66 can be either N-type or P-type and fabricated as Heterojunction Field Effect Transistors (HFETs), Junction Field Effect Transistors (JFETs), Metal Semiconductor Field Effect Transistors (MESFETs), Metal Oxide Semiconductor Field Effect Transistors (MOSFETs), or Insulated Gate Field Effect Transistors (IGFETs).

What is claimed is:

1. A differential input stage having a first and second input and a first and second output, comprising:

a first transistor having a first electrode coupled to the first output, a control electrode coupled to the first input, a second electrode, and a bulk terminal;

a second transistor having a first electrode coupled to the second output, a control electrode coupled to the second input, a second electrode coupled to the second electrode of the first transistor, and a bulk terminal;

a current source circuit having a first terminal coupled to the first electrode of the first transistor and a second terminal coupled to a first power supply terminal for receiving a first power supply voltage;

an offset compensation circuit to reduce offset voltage of the first and second transistors due to transistor mismatch:

a common mode compensation circuit coupled to said first input and said second input to minimize a change in offset voltage due to a common mode input voltage at the first and second inputs; and a switch circuit responsive to the offset compensation circuit and the common mode compensation circuit for selectively providing a differential voltage across the bulk terminals of the first and second transistors.

2. The differential input stage of claim 1, wherein the common mode compensation circuit further comprises:

a third transistor having a first electrode coupled to the first power supply terminal, a control electrode coupled to the first input, and a second electrode;

a fourth transistor having a first electrode coupled to the first power supply terminal, a control electrode coupled to the second input, and a second electrode coupled to the second electrode of the first transistor; and a resistor having a first terminal coupled to the second electrodes of the third transistor and the fourth transistor, and a second terminal coupled to a bias compensation node.

3. The differential input stage of claim 2, further comprising a first current source having a first and a second terminal, wherein the first terminal is coupled to the first power supply terminal for receiving the first power supply voltage and the second terminal is coupled to the bias compensation node.

4. The differential input stage of claim 3, wherein the switch circuit further comprises:

a first switch having a first and a second terminal, wherein the first terminal is coupled to the second power supply terminal for receiving the second power supply voltage, and the second terminal is coupled to the bulk terminal of the first transistor;

a second switch having a first terminal coupled to the second terminal of the first switch and a second terminal coupled to the bias compensation node;

a third switch having a first terminal coupled to the bias compensation nodes and a second terminal coupled to the bulk terminal of the second transistor; and a fourth switch having a first terminal coupled to the second power supply terminal and a second terminal coupled to the second terminal of the third switch.

5. The differential input stage of claim 4, wherein the current source circuit further comprises:

a second current source having a first terminal coupled to the first electrode of the first transistor and a second terminal coupled to the first power supply terminal; and a third current source having a first terminal coupled to the first electrode of the second transistor and a second terminal coupled to the first power supply terminal.

6. The differential input stage of claim 5, wherein the offset compensation circuit has a resistive load coupled between the bias compensation node and the second power supply terminal.

7. The differential input stage of claim 6, wherein the resistive load is comprised of a plurality of selectable resistors.

8. The differential input stage of claim 6, wherein the resistive lead is comprised of a plurality of trimmable resisters.

9. A trimmable differential input stage having a first and second input and a first and second output, comprising:

a first transistor having a drain coupled to the first output, a gate coupled to the first input, a source, and a bulk terminal;

a second transistor having a drain coupled to the second output, a gate coupled to the second input, a source coupled to the source of the first transistor, and a bulk terminal;

a first current source circuit having a first terminal coupled to the sources of the first transistor and the second transistor, and a second terminal coupled to a first power supply terminal for receiving a first power supply voltage; and a trim circuit coupled to said first input and said second input to provide different bias voltages selectively coupled to one of the bulk terminals of the first and second transistors for changing a threshold voltage of said one transistor to reduce an input offset voltage.

10. The trimmable differential input stage of claim 9, wherein the trim circuit further comprises an offset compensation circuit to reduce offset voltage of the first and second transistors due to transistor mismatch.

11. The trimmable differential input stage of claim 10, wherein the trim circuit further comprises a common mode compensation circuit to minimize a change in said input offset voltage due to a common mode input voltage at the first and second inputs.

12. The trimmable differential input stage of claim 11, wherein the trim circuit further comprises an a switch circuit responsive to the offset compensation circuit and the common mode compensation circuit for providing a differential voltage across the bulk terminals of the first and second transistors.

13. The trimmable differential input stage of claim 9, further comprising a second current source having a first terminal coupled to the drain of the first transistor and a second terminal coupled to a second power supply terminal receiving a second power supply voltage; and a third current source having a first terminal coupled to the drain of the second transistor and a second terminal coupled to the second power supply terminal.

14. A method for reducing an input offset voltage of a differential transistor pair having a first input and a second input, comprising the steps of:

providing each transistor of the differential transistor pair in a separate bulk region;

providing voltage potentials by using a trim circuit coupled to said first input and said second input; and selectively biasing each separate bulk region at said different voltage potentials to reduce the input offset voltage.

15. The method of claim 14, further comprising the step of varying said differential voltage potential to said separate bulk regions to compensate for changes in an input common mode voltage of the differential transistor pair which increases the offset voltage.

16. The method for reducing an offset voltage of claim 15 wherein the step of varying a differential voltage across each separate bulk region changes a threshold voltage of each of said for transistors for thermal tracking.

* * * * *